United States Patent
Fujioka et al.

(10) Patent No.: US 8,378,468 B2
(45) Date of Patent: Feb. 19, 2013

(54) SEMICONDUCTOR DEVICE AND METHOD OF MANUFACTURING THE SAME

(75) Inventors: Chie Fujioka, Kyoto (JP); Toshiyuki Yokoe, Osaka (JP); Daichi Kumano, Kyoto (JP)

(73) Assignee: Panasonic Corporation, Osaka (JP)

( * ) Notice: Subject to any disclaimer, the term of this patent is extended or adjusted under 35 U.S.C. 154(b) by 112 days.

(21) Appl. No.: 12/934,033

(22) PCT Filed: Sep. 17, 2009

(86) PCT No.: PCT/JP2009/004666
§ 371 (c)(1),
(2), (4) Date: Sep. 22, 2010

(87) PCT Pub. No.: WO2011/033566
PCT Pub. Date: Mar. 24, 2011

(65) Prior Publication Data
US 2011/0163392 A1 Jul. 7, 2011

(51) Int. Cl.
*H01L 23/495* (2006.01)
(52) U.S. Cl. ... 257/666; 257/676; 257/735; 257/E23.06; 257/E23.031

(58) Field of Classification Search .................. 257/666, 257/676, 678, 735, E23.06, E23.031
See application file for complete search history.

(56) References Cited

U.S. PATENT DOCUMENTS

| | | |
|---|---|---|
| 2004/0217488 A1 | 11/2004 | Luechinger |
| 2009/0152697 A1 | 6/2009 | Tamimoto et al. |
| 2011/0163431 A1* | 7/2011 | Fujioka et al. ................ 257/676 |

FOREIGN PATENT DOCUMENTS

| | | |
|---|---|---|
| JP | 2004-336043 | 11/2004 |
| JP | 2007-194270 | 8/2007 |
| JP | 2009-147103 | 7/2009 |

* cited by examiner

*Primary Examiner* — Hoai V Pham
(74) *Attorney, Agent, or Firm* — Hamre, Schumann, Mueller & Larson, P.C.

(57) ABSTRACT

By increasing the area of a source electrode 3a of a semiconductor element 3 and the area of a source terminal 2b of a lead frame 2, it is possible to extend a joint 8a of the source electrode 3a bonded to a conductive ribbon 6 and a joint 8b of the source terminal 2b. Thus it is possible to reduce an on resistance and easily reduce the number of times a bonding tool comes into contact with the joints to reduce a stress on the semiconductor element 3.

6 Claims, 3 Drawing Sheets

SEMICONDUCTOR DEVICE AND METHOD OF MANUFACTURING THE SAME

TECHNICAL FIELD

The present invention relates to a semiconductor device in which terminals are electrically connected via a conductive ribbon, and a method of manufacturing the same.

BACKGROUND ART

There has been an increasing demand for higher power and a higher withstand voltage in power semiconductor devices in which power semiconductor elements such as a MOS-FET and an IGBT are mounted. Various semiconductor elements and packages for the semiconductor elements have been proposed in response to the demand.

In a semiconductor device of the prior art, a semiconductor element and an external terminal are bonded via a belt of Al (aluminum ribbon) by wedge bonding to reduce an on resistance at the joint of the terminal, so that an electric resistance at the joint is reduced. In another semiconductor device of the prior art, an on resistance is further reduced by providing a large number of joints on the source electrode of a semiconductor element to be subjected to wedge bonding.

FIGS. 3(a) and 3(b) are an explanatory drawing showing the configuration of a semiconductor device of the prior art. FIG. 3(a) is a plan view showing the internal configuration of the MOS-FET of a power semiconductor device that is a semiconductor device of the prior art described in Patent Literature 1. FIG. 3(b) is a sectional view taken along line X-X' of FIG. 3(a).

FIGS. 3(a) and 3(b) show a power semiconductor device 101 including the MOS-FET mounted as a semiconductor element 103 on a lead frame 102. On the major surface of the semiconductor element 103, a source electrode 103a and a gate electrode 103b are formed. The source electrode 103a and the gate electrode 103b are made up of conductive films, mainly Al films. The source electrode 103a is configured with a larger area than the gate electrode 103b to reduce an on resistance. Further, a drain electrode 103c is formed over the opposite surface of the semiconductor element 103 from the major surface. The drain electrode 103c is bonded to a die pad 102a of the lead frame 102 via conductive paste 104 such as Ag paste. The gate electrode 103b is connected to a gate terminal 102c, which has a bonded region extended on the end of a lead of the lead frame 102, via a conductive wire 105 such as an Au wire. The source electrode 103a is connected to a source terminal 102b, which has a bonded region formed by combining the multiple leads 102, via a conductive ribbon 106. The gate terminal 102c and the source terminal 102b have regions bonded to the conductive wire 105 and conductive ribbon 106, respectively. These regions are normally equal in length in the horizontal direction of FIGS. 3(a) and 3(b) (in parallel with a side of the conductive ribbon 106 from the source electrode 103a to the source terminal 102b, hereinafter will be called the longitudinal direction of the conductive ribbon). In many cases, these regions are about 0.5 mm in length. The conductive ribbon 106 is wedge bonded by a wedge tool. Multiple joints 108 called stitches are formed on the source electrode 103a, and then the conductive ribbon 106 is connected to the source terminal 102b according to the same bonding rule, so that the bonded area is increased so as to reduce the on resistance of the source electrode 103a (e.g., see Patent Literature 1).

For example, when the chip size of the semiconductor element 103 is about 2 mm×3 mm, the size of the source electrode 103a is 1.5 mm×2.8 mm, and an aluminum ribbon serving as the conductive ribbon 106 has a width of 1.5 mm and a thickness of 0.1 mm, the on resistance can be reduced by about 20% to 30% by forming two identical joints as compared with the case where a single joint is formed with a width of 0.2 mm to 0.3 mm in the longitudinal direction of the conductive ribbon.

Citation List
Patent Literature
Patent Literature 1: Japanese Patent Laid-Open No. 2004-336043

SUMMARY OF INVENTION

Technical Problem

In the configuration of the prior art, the conductive ribbon 106 is bonded to the source electrode 103a and the source terminal 102b by the same bonding tool. The bonded region of the source terminal 102b is normally smaller than that of the source electrode 103a and thus the shape and size of the end of the bonding tool depend upon the bonded region of the source terminal 102b. In order to increase the bonded area of the source electrode 103a, it is necessary to perform bonding several times on the source electrode 103a, so that the joints 108 are formed at multiple points. Thus the bonding tool is brought into contact with the source electrode 103a several times and the impact of the bonding tool may deteriorate the characteristics of the semiconductor element 103 and result in a complicated process.

Although the area of the source electrode 103a is increased to reduce the on resistance, the formation of the multiple joints 108 called stitches forms loops for the respective stitches and the areas of the loops are present as unbonded regions 108a. Thus this configuration is not preferable for efficiently reducing the on resistance of the extended source electrode 103a.

Since the multiple joints 108 called stitches are formed on the source electrode 103a, the bonded area on the source electrode 103a is increased such that the on resistance is reduced somewhat effectively. On the source terminal 102b, only the joint 108 of one stitch is formed. Thus disadvantageously, the bonded area of the source terminal 102b is not so increased and an on resistance is not reduced on the source terminal 102b.

The present invention has been devised to solve the problems of the prior art. An object of the present invention is to reduce a stress caused by an impact on a semiconductor element and reduce an on resistance without complicating a process.

Solution to Problem

In order to attain the object, a method of manufacturing a semiconductor device according to the present invention in which the electrode of a semiconductor element and the terminal of a lead frame are electrically connected via a conductive ribbon, a method of bonding the conductive ribbon including: disposing the conductive ribbon from the electrode to the terminal; wedge bonding the electrode and the conductive ribbon in one operation by applying ultrasonic vibrations with a wedge tool pressed to a first joint that is a joint of the electrode and the conductive ribbon; and wedge bonding the terminal and the conductive ribbon in one operation by applying ultrasonic vibrations with the wedge tool pressed to a second joint that is a joint of the terminal and the conductive ribbon, wherein the wedge tool has an end substantially identical in shape to the second joint.

Preferably, the conductive ribbon is an aluminum ribbon having a thickness of 0.1 mm and the first joint and the second joint are 1.5 mm×0.8 mm to 0.9 mm in size.

A semiconductor device of the present invention includes: a semiconductor element; at least one first electrode provided on the semiconductor element; at least one second electrode provided on the semiconductor element; a die pad on which the semiconductor element is mounted; at least one first lead including a first terminal electrically connected to the semiconductor element; at least one second lead including a second terminal electrically connected to the semiconductor element; a conductive ribbon electrically connecting the first electrode and the first terminal; a conductor electrically connecting the second electrode and the second terminal; a first joint at which the first electrode and the conductive ribbon are bonded; a second joint at which the first terminal and the conductive ribbon are bonded, the second joint having substantially the same area as the first joint; and molding resin for molding the semiconductor element, the conductive ribbon, the conductor, the first terminal, and the second terminal.

Preferably, the conductive ribbon is an aluminum ribbon having a thickness of 0.1 mm and the first joint and the second joint are 1.5 mm×0.8 mm to 0.9 mm in size.

Preferably, the first joint has a width of at least 33% of the width of the first electrode, the width of the first joint being a length along the connection direction of the conductive ribbon.

Preferably, the first terminal has a width increased by about 0.1 mm to 0.5 mm from the width of the second terminal, the widths being lengths along the longitudinal direction of the conductive ribbon.

Preferably, the first joint has a width of at least 75% of the width of the first terminal, the widths being lengths along the longitudinal direction of the conductive ribbon.

A semiconductor device of the present invention includes: a power semiconductor element; a source electrode provided on the surface of the power semiconductor element; a gate electrode provided on the surface of the power semiconductor element; a drain electrode provided on the back side of the power semiconductor element; a die pad on which the power semiconductor element is mounted, the die pad being electrically connected to the drain electrode; a source lead including a source terminal having a width of 1.0 mm in the longitudinal direction of the lead; a gate lead including a gate terminal having a width of 0.5 mm in the longitudinal direction of the lead; a drain lead electrically connected to the die pad; an aluminum ribbon that electrically connects the source electrode and the source terminal and has a thickness of 0.1 mm; a conductive wire electrically connecting the gate electrode and the gate terminal; a first joint at which the source electrode and the aluminum ribbon are bonded to each other, the first joint having a size of 1.5 mm×0.8 mm to 0.9 mm; a second joint at which the source terminal and the aluminum ribbon are bonded to each other, the second joint having substantially the same area as the first joint; and molding resin for molding the power semiconductor element, the aluminum ribbon, the conductive wire, the source terminal, and the gate terminal.

With this configuration, it is possible to reduce a stress caused by an impact on the semiconductor element and reduce an on resistance without complicating a process.

Advantageous Effects Of Invention

As has been discussed, the area of the source electrode of a semiconductor element and the area of the source terminal of a lead frame are increased and the end of a bonding tool is substantially identical in shape to a joint, so that it is possible to extend the joint of the source electrode bonded to a conductive ribbon and the joint of the source terminal only by a single bonding operation. Thus it is possible to reduce an on resistance and easily reduce the number of times the bonding tool comes into contact with the joints, thereby reducing a stress on the semiconductor element.

DESCRIPTION OF EMBODIMENTS

The following will describe embodiments of the present invention in accordance with the accompanying drawings. A power semiconductor device will be described as an example.

(First Embodiment)

Figure 1A:
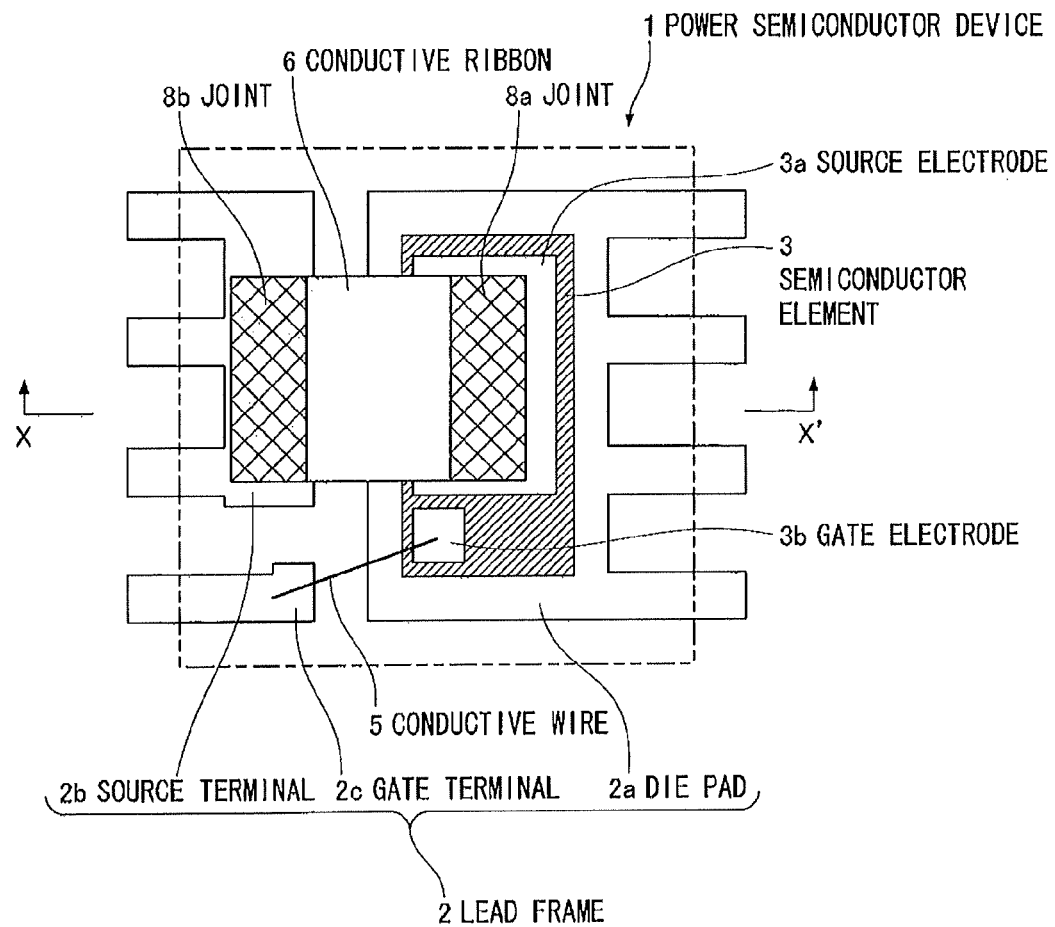
FIG. 1(a) is an explanatory drawing showing the configuration of a semiconductor device according to a first embodiment.
Figure 1B:
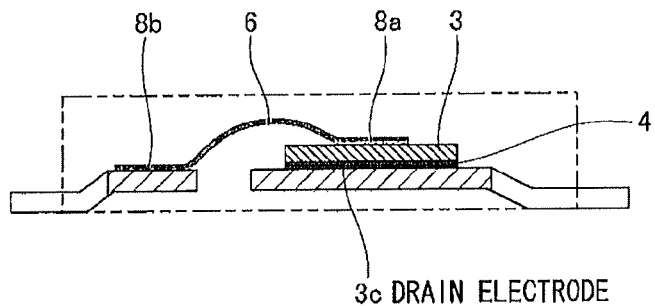
FIG. 1(b) is an explanatory drawing showing the configuration of the semiconductor device according to the first embodiment.

FIG. 1 is an explanatory drawing showing the configuration of a semiconductor device according to a first embodiment. FIG. 1(a) is a plan view showing the internal configuration of the MOS-FET of a power semiconductor device illustrated as an example of the semiconductor device according to the first embodiment of the present invention. FIG. 1(b) is a sectional view taken along line X-X' of FIG. 1(a).

FIGS. 1(a) and 1(b) show a power semiconductor device 1 including the MOS-FET mounted as a semiconductor element 3 on a lead frame 2. On the major surface of the semiconductor element 3, a source electrode 3a and a gate electrode 3b are formed. The source electrode 3a and the gate electrode 3b are made up of conductive films, mainly Al films. The source electrode 3a is configured to have a larger area than the gate electrode 3b to reduce an on resistance. Further, a drain electrode 3c is formed over the opposite surface of the semiconductor element 3 from the major surface. The drain electrode 3c is bonded to a die pad 2a of the lead frame 2 via conductive paste 4 such as Ag paste. The gate electrode 3b is connected to a gate terminal 2c of the lead frame 2 via a conductive wire 5 such as an Au wire. This configuration is identical to that of the prior art. In this example, a conductor connecting the electrode and the terminal is conductive paste or a conductive wire. Other conductors such as bumps may be used. Alternatively, the electrode and the terminal may be connected only via a conductive ribbon 6 that will be described below.

The following will specifically describe the characteristics of the present invention.

The source electrode 3a is connected to a source terminal 2b of the lead frame 2 via the conductive ribbon 6. The conductive ribbon 6 is wedge bonded using a bonding tool. The area of the source electrode 3a is set such that the area of a joint 8a serving as a bonded region to the conductive ribbon 6 is large enough to sufficiently reduce a resistance. Similarly, the source terminal 2b is extended in the longitudinal direction of the conductive ribbon such that the area of a joint 8b is large enough to sufficiently reduce a resistance. The joint 8a at which the source electrode 3a and the conductive ribbon 6 are bonded and the joint 8b at which the source terminal 2b and the conductive ribbon 6 are bonded have substantially the same area. The bonded region of the source terminal 2b is also increased and the joint 8b has substantially the same shape and area as the joint 8a. Thus during wedge bonding, the conductive ribbon 6 and the source electrode 3a are bonded by a single bonding operation and the conductive ribbon 6 and the source terminal 2b are bonded by a single bonding operation, by using the end of a single bonding tool.

For example, when the chip size of the semiconductor element 3 is about 2 mm×3 mm, the size of the source electrode 3a is 1.5 mm×2.8 mm, and an aluminum ribbon serving as the conductive ribbon 6 has a width of 1.5 mm and a thickness of 0.1 mm, the width of the connected region of the gate terminal 2c is kept at 0.5 mm, which is a typical size, in the longitudinal direction of the conductive ribbon, the connected region of the source terminal 2b is increased in width to 1.0 mm in the longitudinal direction of the conductive ribbon, and the joint 8a and the joint 8b are 0.8 mm to 0.9 mm in width in the longitudinal direction of the conductive ribbon. Thus as compared with bonding at two points according to the prior art, the on resistance can be further reduced by about 20% to 30%. Moreover, the end of the bonding tool used in the bonding is 1.5 mm×0.8 mm to 0.9 mm in size, so that each of the joints 8a and 8b can be formed by pressure welding at a time.

At this point, the joint 8a is preferably formed by wedge bonding at a time such that the bonding width of the joint 8a in the longitudinal direction of the conductive ribbon is at least 33% of the width of the source electrode 3a in the longitudinal direction of the conductive ribbon. Further, the joint 8b has a bonded region extended in the longitudinal direction of the conductive ribbon 6 such that the joint 8b can be formed at a time with a bonding width of at least 75% of the length of the source terminal 2b in the longitudinal direction of the conductive ribbon 6. The joint 8a formed on the source electrode 3a and the joint 8b formed on the source terminal 2b have substantially the same bonded area. To be specific, when the source electrode 3a has a width of 1.5 mm, the width of the joint connected in one operation is preferably about 0.5 mm. Further, when the source terminal 2b has a width of about 0.6 mm, the width of the joint connected in one operation is preferably about 0.5 mm.

By using the wide conductive ribbon 6, the bonding width of the joint is increased in a direction crossing the longitudinal direction of the conductive ribbon, so that the bonded area of the joint is increased. The bonded area is increased also by providing multiple conductive ribbons 6.

With this configuration, the areas of the source electrode 3a and the source terminal 2b are increased, so that the bonded areas of the joint 8a on the source electrode 3a and the joint 8b on the source terminal 2b are efficiently increased such that the joints 8a and 8b have substantially the same shape and area. Thus the on resistance can be reduced by a simple configuration. The end of the used bonding tool matches with the shapes of the joint 8a and the joint 8b, and the joints can be bonded by pressing the bonding tool once to each of the joints. Thus it is possible to reduce, with a simple method, the number of times the bonding tool comes into contact with the joints, thereby reducing a stress on the semiconductor element. Moreover, the source terminal 2b increased in size can improve heat absorption and heat dissipation.

Although the single conductive ribbon 6 is connected in the present embodiment, multiple conductive ribbons 6 may be connected.

(Second Embodiment)

FIG. 2 is a process sectional view showing a method of manufacturing a semiconductor device according to a second embodiment.

Figure 2A:
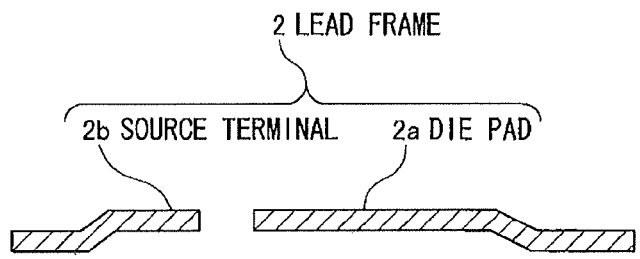
FIG. 2(a) is a process sectional view showing a method of manufacturing a semiconductor device according to a second embodiment.
Figure 2B:
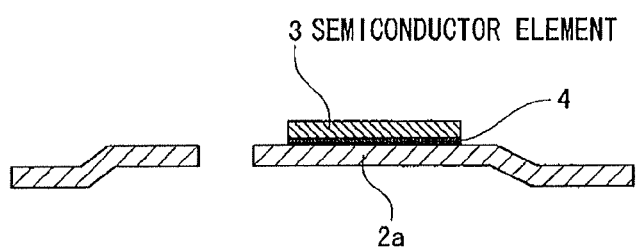
FIG. 2(b) is a process sectional view showing the method of manufacturing the semiconductor device according to the second embodiment.
Figure 2C:
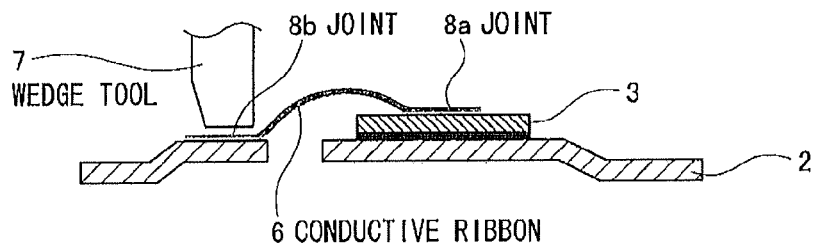
FIG. 2(c) is a process sectional view showing the method of manufacturing the semiconductor device according to the second embodiment.

In FIG. 2, first, a lead frame 2 (FIG. 2(a)) is placed on a die bonder (not shown). The lead frame 2 includes: a die pad 2a that is made of copper, a copper alloy, or an iron-nickel alloy and has a semiconductor element 3 placed thereon; a drain terminal (not shown) serving as a first terminal extending from the die pad 2a; a source terminal 2b serving as a second terminal disposed near the die pad 2a; and a gate terminal 2c (see FIG. 1, the same hereinafter) disposed as a third terminal near the die pad 2a. In the lead frame 2 of the present embodiment, the length of the source terminal 2b, which is connected via a conductive ribbon 6, in the longitudinal direction of the conductive ribbon is increased by about 0.1 mm to 0.5 mm from the length of the gate terminal 2c. The following will describe an example of a power semiconductor device having three terminals. The present invention is also applicable to a semiconductor device having two terminals or at least four terminals.

Next, the semiconductor element 3 is placed on the die pad 2a. The semiconductor element 3 is an IGBT, a MOS-FET, and so on. The following will describe a power MOS-FET in which a source electrode 3a (see FIG. 1, the same hereinafter) and a gate electrode 3b (see FIG. 1, the same hereinafter) are formed on the major surface of the semiconductor element 3 and a drain electrode 3c (see FIG. 1, the same hereinafter) is formed substantially over the back side of the semiconductor element 3. On the die pad 2a, the semiconductor element 3 is placed via silver paste serving as conductive paste 4 and is heated to 150° to 200° to temporarily melt the conductive paste 4. After that, the semiconductor element 3 is cooled, so that the drain electrode of the semiconductor element 3 and the drain terminal of the die pad 2a are connected to each other (FIG. 2(b)).

Next, the lead frame 2 on which the semiconductor element 3 is placed is set on a wedge bonder (not shown), the end of a wedge tool 7 is pressed to the source electrode 3a on which an aluminum ribbon or the like is supplied as the conductive ribbon 6, and ultrasonic vibrations are applied to the conductive ribbon 6, so that the conductive ribbon 6 is bonded to the source electrode 3a. Further, the end of the wedge tool 7 is moved and is pressed to the source terminal 2b via the conductive ribbon 6, and then ultrasonic vibrations are applied to the conductive ribbon 6, so that the conductive ribbon 6 is bonded to the source terminal 2b (FIG. 2(c)). In this case, the bonded areas of the conductive ribbon 6 to the source electrode 3a and the source terminal 2b are substantially equal, and the shapes and areas of joints 8a and 8b depend upon the width of the conductive ribbon 6 and the shape of the wedge tool 7. Moreover, in the present embodiment, the connected area of the joint 8b is increased by extending the connected area of the conductive ribbon 6 on the source terminal 2b, so that the area of the joint 8b can be increased. Since the end of the wedge tool 7 for wedge bonding is substantially identical in shape to the joint 8b, the area of the joint 8b is increased and a resistance is reduced. Further, the source electrode 3a and the source terminal 2b can be bonded to the conductive ribbon 6 by applying ultrasonic vibrations once to each of the source electrode 3a and the source terminal 2b, achieving stable bonding with a small stress on the semiconductor element 3 by a simple and reliable method.

Next, the lead frame 2 on which the semiconductor element 3 is placed is set on a wire bonder (not shown), a gold wire serving as a conductive wire 5 (see FIG. 1, the same hereinafter) is supplied to the lead frame 2, a bonding tool (not shown) on which a small ball is formed beforehand is pressed to the gate electrode 3b, and ultrasonic vibrations are applied to the conductive wire 5, so that the conductive wire 5 is bonded to the gate electrode 3b. After that, the bonding tool (not shown) is moved to the gate terminal 2c and the conductive wire 5 is bonded to the gate terminal 2c.

Figure 2D:
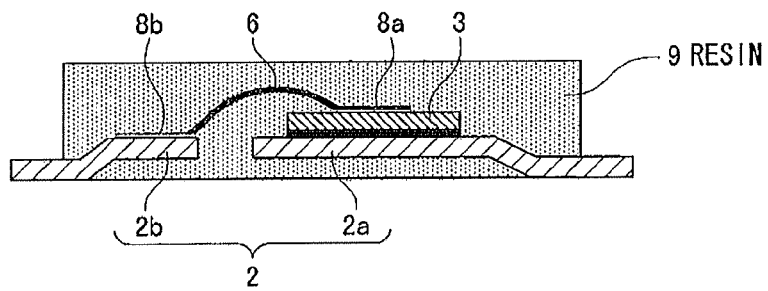
FIG. 2(d) is a process sectional view showing the method of manufacturing the semiconductor device according to the second embodiment.
Figure 3A:
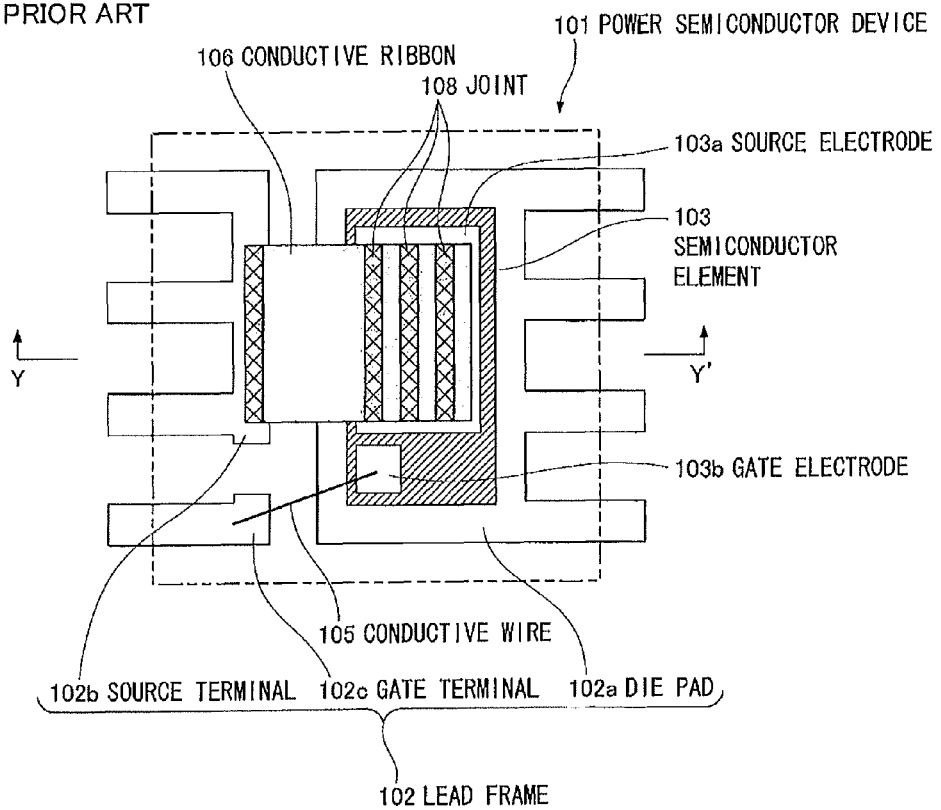
FIG. 3(a) is an explanatory drawing showing the configuration of a semiconductor device of the prior art.
Figure 3B:
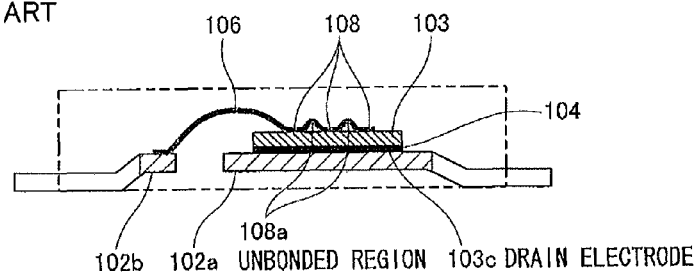
FIG. 3(b) is an explanatory drawing showing the configuration of the semiconductor device of the prior art.

Finally, the semiconductor element 3, the conductive ribbon 6, the conductive wire 5, and the inner portions of the terminals are molded with resin 9 (FIG. 2(d)).

As has been discussed, the lead frame is prepared in which the semiconductor element includes the electrode large enough to sufficiently reduce a connection resistance and the terminal is increased in length in the longitudinal direction of the conductive ribbon such that the terminal is, e.g., about 0.6 mm to 1.0 mm in width. By using the wedge tool whose end is identical in shape to the joint of the terminal, the electrode and the terminal are wedge bonded via the conductive ribbon. Thus it is possible to reduce a stress caused by an impact on the semiconductor element and reduce the on resistance without complicating a process.

Industrial Applicability

The present invention is useful for a semiconductor device and a method of manufacturing the same which can reduce a stress caused by an impact on a semiconductor element, reduce an on resistance without complicating a process, and electrically connect terminals via a conductive ribbon.

The invention claimed is:

1. A semiconductor device comprising:
   a semiconductor element;
   at least one first electrode provided on the semiconductor element;
   at least one second electrode provided on the semiconductor element;
   a die pad on which the semiconductor element is mounted;
   at least one first lead including a first terminal electrically connected to the semiconductor element;
   at least one second lead including a second terminal electrically connected to the semiconductor element;
   a conductive ribbon electrically connecting the first electrode and the first terminal;
   a conductor electrically connecting the second electrode and the second terminal;
   a first joint at which the first electrode and the conductive ribbon are bonded, wherein the first joint is the only joint that is bonded directly to the first electrode and the conductive ribbon;
   a second joint at which the first terminal and the conductive ribbon are bonded, the second joint having substantially a same area as the first joint; and
   molding resin for molding the semiconductor element, the conductive ribbon, the conductor, the first terminal, and the second terminal.

2. The semiconductor device according to claim 1, wherein the conductive ribbon is an aluminum ribbon having a thickness of 0.1 mm and the first joint and the second joint are 1.5 mm×0.8 mm to 0.9 mm in size.

3. The semiconductor device according to claim 1, wherein the first joint has a width of at least 33% of a width of the first electrode, the width of the first joint being a length along a connection direction of the conductive ribbon.

4. The semiconductor device according to claim 1, wherein the first terminal has a width increased by about 0.1 mm to 0.5 mm from a width of the second terminal, the widths being lengths along a longitudinal direction of the conductive ribbon.

5. The semiconductor device according to claim 1, wherein the first joint has a width of at least 75% of a width of the first terminal, the widths being lengths along a longitudinal direction of the conductive ribbon.

6. A semiconductor device comprising:
   a power semiconductor element;
   a source electrode provided on a surface of the power semiconductor element;
   a gate electrode provided on the surface of the power semiconductor element;
   a drain electrode provided on a back side of the power semiconductor element;
   a die pad on which the power semiconductor element is mounted, the die pad being electrically connected to the drain electrode;
   a source lead including a source terminal having a width of 1.0 mm in a longitudinal direction of the lead;
   a gate lead including a gate terminal having a width of 0.5 mm in a longitudinal direction of the lead;
   a drain lead electrically connected to the die pad;
   an aluminum ribbon that electrically connects the source electrode and the source terminal and has a thickness of 0.1 mm;
   a conductive wire electrically connecting the gate electrode and the gate terminal;
   a first joint at which the source electrode and the aluminum ribbon are bonded to each other, the first joint having a size of 1.5 mm×0.8 mm to 0.9 mm;
   a second joint at which the source terminal and the aluminum ribbon are bonded to each other, the second joint having substantially a same area as the first joint; and
   molding resin for molding the power semiconductor element, the aluminum ribbon, the conductive wire, the source terminal, and the gate terminal.

* * * * *